United States Patent [19]

Nakajima et al.

[11] Patent Number: 4,683,643

[45] Date of Patent: Aug. 4, 1987

[54] METHOD OF MANUFACTURING A VERTICAL MOSFET WITH SINGLE SURFACE ELECTRODES

[75] Inventors: Shigeru Nakajima, Chigasaki; Kazushige Minegishi, Atsugi; Kenji Miura, Isehara; Takashi Morie; Toshifumi Somatani, both of Zama, all of Japan

[73] Assignee: Nippon Telegraph and Telephone Corporation, Tokyo, Japan

[21] Appl. No.: 756,135

[22] Filed: Jul. 16, 1985

[30] Foreign Application Priority Data

Jul. 16, 1984 [JP] Japan .................... 59-146037

[51] Int. Cl.⁴ .................. H01L 21/385; H01L 21/388; H01L 21/40; H01L 29/78
[52] U.S. Cl. .................................. 437/203; 357/23.4; 148/DIG. 168; 437/40; 437/225
[58] Field of Search ................. 357/23.4; 29/571, 580, 29/591; 148/DIG. 168; 427/86, 255.2, 255.3

[56] References Cited

U.S. PATENT DOCUMENTS

| | | | |
|---|---|---|---|
| 3,518,509 | 6/1970 | Cullis | 357/23.4 |
| 4,455,740 | 6/1984 | Iwai | 29/571 |
| 4,476,622 | 10/1984 | Cogan | 29/571 |
| 4,528,047 | 7/1985 | Beyer et al. | 148/175 |
| 4,577,208 | 3/1986 | Schutten et al. | 357/23.4 |
| 4,577,395 | 3/1986 | Shibata | 29/576 C |
| 4,587,712 | 5/1986 | Baliga | 29/571 |

OTHER PUBLICATIONS

"VMOS ROM" by T. J. Rodgers et al., IEEE Journal of Solid-State Circuits, vol. SC-11, No. 5, Oct. 1976, pp. 614–621.

"VMOS: High-Speed TTL Compatible MOS Logic" by T. J. Rodgers et al., IEEE Journal of Solid-State Circuits, vol. SC-9, No. 5, Oct. 1974.

Primary Examiner—Olik Chaudhuri
Attorney, Agent, or Firm—Townsend & Townsend

[57] ABSTRACT

A vertical metal oxide semiconductor field effect transistor has a trench substantially vertically formed in a major surface of a semiconductor substrate, a first conductive layer formed in a predetermined region including a side wall surface of the trench on a gate insulating film, lower and upper diffusion layers formed in the bottom of the trench and a surface layer of the semiconductor substrate, preferably a channel doped region formed in the semiconductor substrate between the upper and lower diffusion layers, and a second conductive layer formed in contact with the lower diffusion layer in the bottom of the trench and insulated from the first conductive layer so as to fill the trench. The first conductive layer serves as a gate electrode, and the diffusion layers serves as source/drain regions, respectively. A method of manufacturing the vertical MOSFET is also proposed.

12 Claims, 20 Drawing Figures

METHOD OF MANUFACTURING A VERTICAL MOSFET WITH SINGLE SURFACE ELECTRODES

BACKGROUND OF THE INVENTION

The present invention relates to a vertical MOSFET formed in a trench formed in a major surface of a semiconductor substrate, and a method of manufacturing the same.

A conventional vertical MOSFET (Metal Oxide Semiconductor Field Effect Transistor) has a compact structure but provides a large current drive capability as compared with a conventional lateral MOSFET. A typical example of a conventional vertical MOSFET is illustrated in FIGS. 1 and 2. Referring to FIG. 1, an n-type layer 2 is formed on a major surface of a p-type silicon substrate 1. A V-groove 3 is formed to be deeper than the n-type layer 2 and reaches the p-type silicon substrate 1. The V-groove 3 has an inverted quadrilateral pyramid shape, as indicated by the broken lines of FIG. 2. A gate oxide film 4 is formed in the V-groove 3. A gate electrode 5 is then formed on the gate oxide film 4. A p-type layer 6 is formed in a surface layer of the n-type layer 2 around the V-groove. Although omitted in FIG. 1, an Al electrode wiring layer connected to the p-type layer 6 through an insulating film is formed on the substrate surface. An electrode wiring layer connected to the gate electrode 5 is also formed. Referring to FIG. 2, reference numeral 19A denotes a contact hole formed in the insulating film so as to electrically connect the p-type layer 6 to an Al electrode wiring layer 20A indicated by a hatched region. A dotted region 16A represents a gate electrode including the gate electrode 5 and the wiring layer 20A formed integrally therewith. A region 14A of FIG. 2 corresponds to the V-groove 3 of FIG. 1. A region 18A surrounded by an alternate long and short dashed line represents an element formation region.

In the structure described above, the p-type layer 6 and the p-type silicon substrate 1 constitute source/drain regions, respectively. It is difficult to form a contact at the bottom of the V-groove. For this reason, the conventional VMOSFET can be used only when the contact for the source/drain region at the bottom of the V-groove is not required, i.e., only when the source/drain regions are used as a common terminal.

If an electrode of the source/drain region in the bottom of the V-groove is formed, a contact hole must be formed in a region excluding the V-groove region. For this reason, the transistor area is increased when viewed from the top, resulting in inconvenience.

Before assessing current drive capabilities of conventional vertical and lateral MOSFETs, i.e., magnitudes of currents flowing through the source-drain paths thereof, a structure of a typical conventional lateral MOSFET will be briefly described. As shown in FIG. 3, a gate electrode 16B is connected to a gate region (not shown) through a gate insulating film (not shown). Al electrode wiring layers 20B constituting source/drain electrodes are electrically connected to corresponding source/drain regions through contact holes 19B. The lateral MOSFET does not have the V-groove 3 shown in FIG. 1. Reference symbol W denotes a channel width.

Now the current drive capabilities of the conventional vertical and lateral MOSFETs are assessed. In this case, a minimum pattern size and an overlay accuracy are given as 1 $\mu$m and 0.5 $\mu$m, respectively. Minimum element formation regions of the vertical and lateral MOSFETs are $2\times4.5$ $\mu m^2$ and $2\times6$ $\mu m^2$. In this case, the effective channel width W (FIG. 3) of the lateral MOSFET corresponds to the length of the gate electrode 16A and is 1 $\mu$m. The effective channel width of the vertical MOSFET is a length around the V-groove 3 (FIG. 1). Since a length of the upper portion of the V-groove 3 is different from that of the bottom portion thereof, normally, the effective channel width is given at an intermediate depth as indicated by arrows. For example, as shown in FIG. 2, a length at an intermediate depth between the square opening having a 1-$\mu$m side and the vertex of the inverted quadrilateral pyramid as the effective channel width is given to be 0.5 $\mu$m$\times4=2$ $\mu$m. The current drive capabilities of the FETs are proportional to the effective channel widths when their other characteristics are identical and their effective channel lengths are equal. The current drive capabilities of the conventional vertical and lateral MOSFETs are given to be as low as 0.25 and 0.17 when the effective channel widths are standardized per unit element formation area.

SUMMARY OF THE INVENTION

It is, therefore, a principal object of the present invention to provide a vertical MOSFET and a method of manufacturing the same, wherein an application is available even if one of source/drain regions is not used as a common terminal.

It is another object of the present invention to provide a vertical MOSFET and a method of manufacturing the same, wherein the transistor area is decreased when viewed from the top.

It is still another object of the present invention to provide a vertical MOSFET having a high current drive capability and a method for manufacturing the same.

According to an aspect of the present invention, there is provided a vertical metal oxide semiconductor field effect transistor, comprising: a trench substantially vertically formed in a major surface of a semiconductor substrate; a first conductive layer formed in a predetermined region including a side wall surface of the trench through gate insulating film, the first conductive layer serving as a gate electrode; lower and upper diffusion layers formed in a bottom of the trench and in a surface layer of the semiconductor substrate, the diffusion layers serving as source/drain regions, respectively; and a second conductive layer formed in contact with the lower diffusion layer in the bottom of the trench and insulated from the first conductive layer so as to fill the trench.

According to another aspect of the present invention, there is provided a method of manufacturing a vertical metal oxide semiconductor field effect transistor, comprising the steps of: forming a trench in a major surface of a semiconductor substrate of a first conductivity type, the trench having a side wall surface substantially perpendicular to the major surface of the semiconductor substrate, and the trench being formed adjacent to a predetermined region as a source/drain region in the semiconductor substrate; forming a gate insulating film on at least the side wall surface of the trench; forming a first conductive layer in an inner wall surface of the trench so as not to completely fill the trench with the first conductive layer; removing the first conductive layer and the gate insulating film from a predetermined region of a bottom of the trench; forming an insulating film on a surface of the first conductive layer; forming a diffusion layer of the second conductivity type in the bottom of the trench; and forming an electrode pattern.

DESCRIPTION OF THE PREFERRED EMBODIMENT

Figure 4:
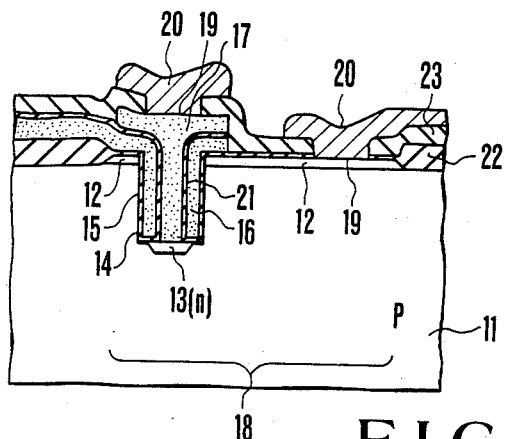
FIG. 4 is a sectional view of a vertical MOSFET according to an embodiment of the present invention.
Figure 5:
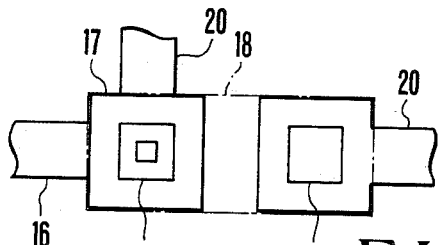
FIG. 5 is a plan view of the vertical MOSFET shown in FIG. 4.

FIG. 4 is a sectional view of a vertical MOSFET according to an embodiment of the present invention, and FIG. 5 is a plan view thereof. Referring to FIGS. 4 and 5, reference numeral 11 denotes a p-type silicon substrate; 12 and 13, n-type diffusion layers serving as source/drain regions, respectively; 14, a trench; 15, a gate oxide film; 16, a gate electrode; 17, an electrode of the source/drain region 13 formed in the bottom layer of the trench 14; 18, an element formation region; 19, contact holes for connecting the source/drain regions 12 and 13 to Al electrode wiring layers 20, respectively.

The trench 14 is formed substantially vertically in a major surface of the p-type silicon substrate 11. The source/drain regions 12 and 13 are formed in a surface layer of the substrate and a bottom of the trench 14, respectively. The gate electrode 16 is formed to cover the side wall of the trench 14 through the gate oxide film 15. The electrode 17 is formed to fill the trench 14 while insulated by an insulating film 21. Reference numeral 22 denotes an element isolation insulating film; and 23, an insulating interlayer. Although omitted in FIGS. 4 and 5, a channel doped region (to be described later) is formed between the source/drain regions.

Figure 1:
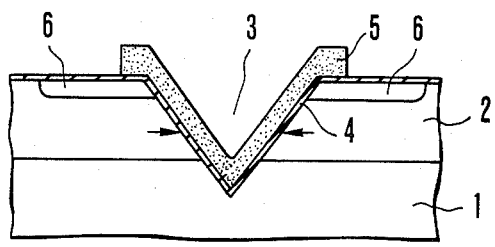
FIG. 1 is a sectional view of a conventional vertical MOSFET.
Figure 2:
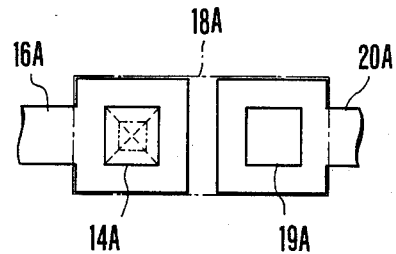
FIG. 2 is a plan view of the vertical MOSFET shown in FIG. 1.
Figure 3:
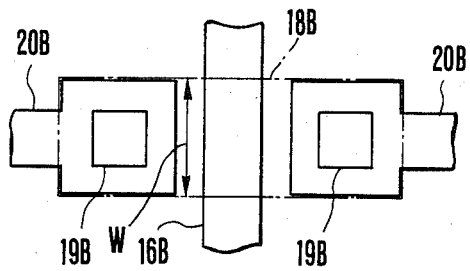
FIG. 3 is a plan view of a conventional lateral MOSFET.

With the above arrangement, the vertical MOSFET of this embodiment has a high current drive capability. The maximum pattern size and the overlay accuracy are given as 1 μm and 0.5 μm, respectively, as previously described. A minimum element formation region of the FET is 2×5 μm² which is larger than that (2×4.5 μm²) of the conventional vertical MOSFET (FIGS. 1 and 2). However, an effective channel width of the vertical MOSFET of this embodiment corresponds to a length around the square trench 14 having 1-μm side, thereby obtaining the effective channel width of 4 μm (=1×4). This effective channel width is longer than that (1 μm) of the conventional lateral MOSFET (FIG. 3) and that (2 μm) of the conventional vertical MOSFET (FIGS. 1 and 2). Therefore, the current drive capability of the vertical MOSFET of this embodiment is 0.40 as compared with that (0.17) of the conventional lateral MOSFET and that (0.25) of the conventional vertical MOSFET. As a result, the current drive capability of the vertical MOSFET of this embodiment is increased to 2 to 2.5 times that of the conventional lateral MOSFET and about 1.6 times that of the conventional vertical MOSFET.

In addition to the high current drive capability, the vertical MOSFET of this embodiment also achieves high-speed operation for the following reason. In the conventional vertical MOSFET, one of the source and drain must serve as a common terminal. Unlike in the conventional MOSFET, the vertical MOSFET of this embodiment does not have such a limitation. When the source/drain region 13 is used as an output terminal, the diffusion layer as the region 13 is limited to a predetermined region at the bottom layer of the trench 14, thereby decreasing a junction capacitance and hence improving the operation speed.

A method of manufacturing the vertical MOSFET described above will be described in detail by way of examples.

EXAMPLE 1

Figure 6:
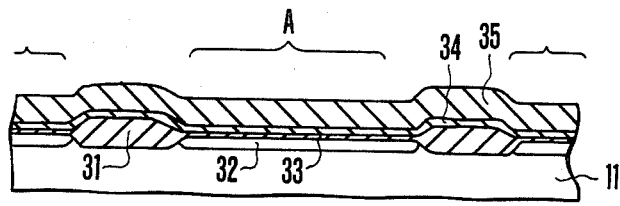

As shown in FIG. 6, a thick element isolation silicon oxide film (i.e., a guard ring) 31 is formed on the major surface of the p-type silicon substrate 11. Arsenic ions are implanted in an active region (i.e., a prospective element formation region) A isolated by the thick element isolation silicon oxide film 31 to form a 0.2 μm thick n-type layer 32 serving as a source/drain region. A surface layer of the substrate 11 is thermally oxidized to form a thin silicon oxide film 33 on the active region A. Chemical vapor deposition is performed to deposit a 1,000 Å thick silicon nitride film 34 on the silicon oxide film 33 and a 9,000 Å thick phosphosilicate glass (PSG) film 35 on the silicon nitride film 34.

Figure 7:
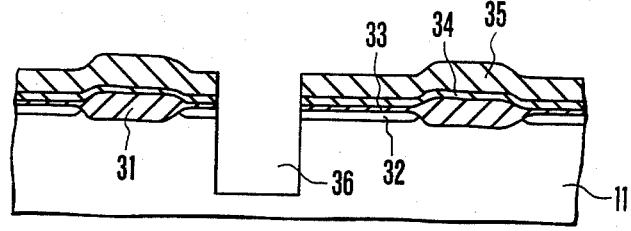

As shown in FIG. 7, a resist pattern having a side of 1 μm is formed on the PSG film 35 by lithography such that an opening of the resist pattern corresponds to a predetermined trench region. The PSG film 35, the silicon nitride film 34 and the silicon oxide film 33 are etched by reactive ion etching (RIE) using the resist pattern as a mask. After the resist pattern is removed, the silicon substrate 11 is etched by RIE using the PSG film 35 as a mask, thereby forming a 1.5 μm deep trench 36.

Figure 8:
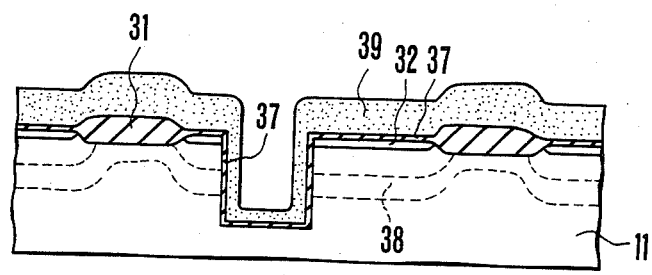

As shown in FIG. 8, after the PSG film 35 is etched by a hydrofluoric acid solution, the surface of the substrate 11 in the trench is etched by 1,000 Å by a solution mixture of hydrofluoric acid and nitric acid so as to eliminate etching contamination and damage. Subsequently, the silicon nitride film 34 is etched by the hot phosphoric acid solution, and the silicon oxide film 33 is etched by the hydrofluoric acid solution. Thermal oxidation is performed to form a 300 Å thick gate oxide film 37, and boron ions are implanted in the substrate 11 to form a channel doped layer 38 at a predetermined depth. The channel doped layer 38 is shallower at the thick silicon oxide film 31 than in the element formation region. The channel doped layer 38 is indicated by a region defined by two broken lines of FIG. 8. The central portion of the region has the highest boron concentration, and the concentration is gradually decreased along the vertical direction in accordance with the Gauss distribution. A phosphorus-doped polysilicon film 39 is formed to cover the entire surface by low pressure CVD (LPCVD) using monosilane gas containing phosphine. In this case, a phosphorus concentration of the polysilicon film 39 is $1 \times 10^{21}$ cm$^{-3}$. The mixing ratio of the source gases is controlled to obtain a thickness of 7,000 Å on the major surface of the silicon substrate 11 and a thickness of 3,000 Å in the inner surface of the trench 36. It should be noted that the polysilicon film 39 serves as a gate electrode.

Figure 9:
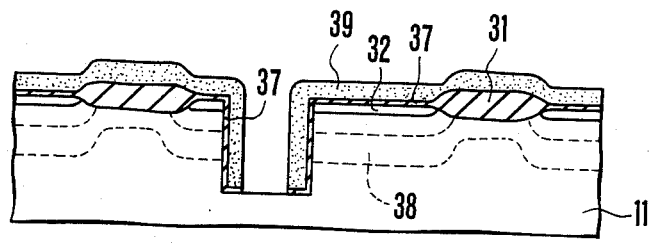

Thereafter, anisotropic etching such as RIE is performed to remove the polysilicon film 39 from the bottom of the trench 36, and the gate oxide film 37 in the bottom of the trench 36 is also etched by the hydrofluoric acid solution, as shown in FIG. 9.

Figure 10:
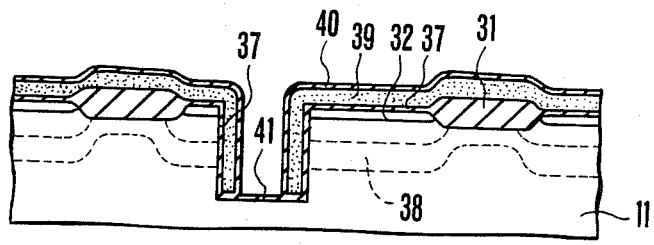

As shown in FIG. 10, wet oxidation at a temperature of 600° to 650° C. is performed to form an oxide film so as to cover the entire surface. In this case, the growth rate of the oxide film is high on the phosphorus-doped polysilicon film 39, so that a 1,500 Å thick silicon oxide film 40 is formed on the polysilicon film 39. However, a 100 Å thick silicon oxide film 41 is formed on the surface of the silicon substrate 11 which defines the bottom of the trench.

Figure 11:
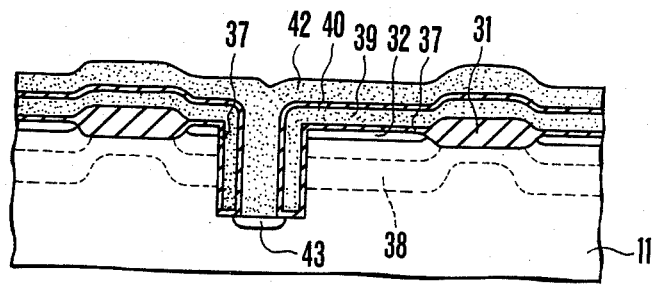

As shown in FIG. 11, only the silicon oxide film 41 is etched by the hydrofluoric acid solution. A second phosphorus-doped polysilicon film 42 having a high phosphorus concentration is filled by CVD in the trench. The resultant structure is then annealed to diffuse phosphorus from the polysilicon film 42 to the silicon substrate 11, thereby forming an n-type layer 43.

Figure 12:
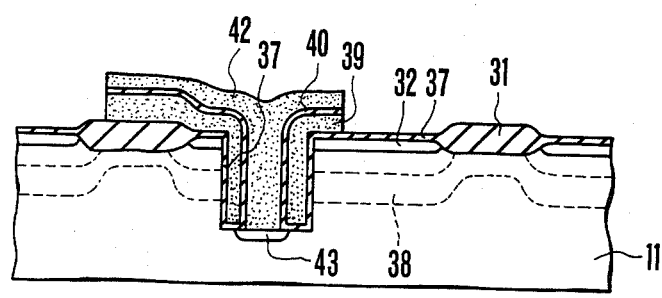

As shown in FIG. 12, a predetermined gate electrode resist pattern is formed by lithography, and the second polysilicon film 42, the silicon oxide film 40 and the first polysilicon film 39 are sequentially etched by RIE using the resist pattern as a mask.

Figure 13:
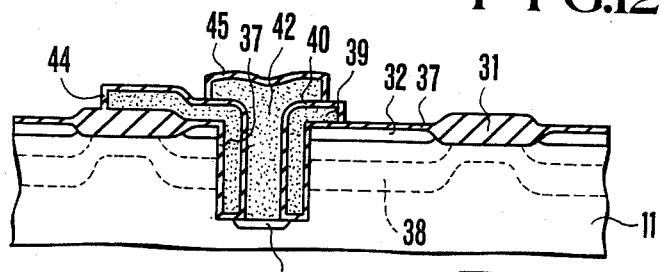

As shown in FIG. 13, after the resist pattern is removed, a predetermined resist pattern for the polysilicon film 42 is formed by lithography, and the polysilicon film 42 is etched by using the resist pattern as a mask. After the resist pattern is removed, thermal oxidation is performed to form a 1,000 Å thick silicon oxide film 44 and a 1,000 Å thick silicon oxide film 45 on the exposed side wall surface and the exposed upper surface, respectively, of the polysilicon film 42.

Figure 14:
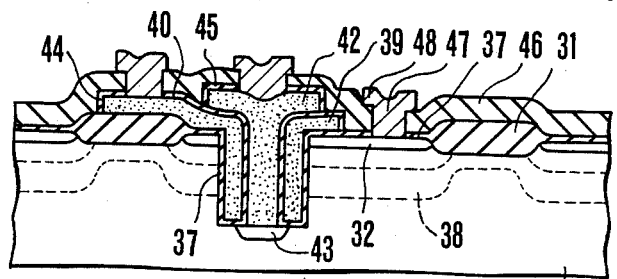

As shown in FIG. 14, a PSG film 46 is formed as an insulating interlayer and is reflowed. Contact holes 47 are formed in the PSG film, and an Al electrode pattern 48 is formed.

Figure 15:
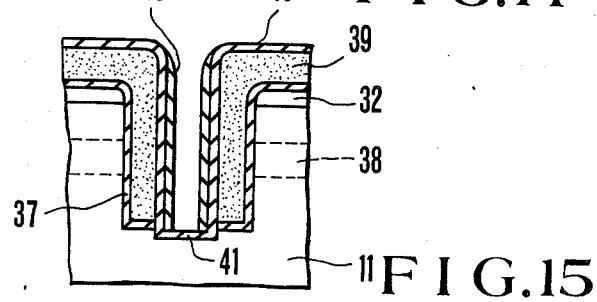

In order to improve the dielectric breakdown voltage between the first and second polysilicon films 39 and 42 at the edge of the bottom of the trench, the following process may be utilized. In the step of FIG. 9, after the polysilicon film 39 and the silicon oxide film 37 are etched from the bottom of the trench, a surface layer of the p-type silicon substrate 11 may be etched by about 1,000 Å. After the silicon oxide films 40 and 41 are formed, a thin 1,000 Å thick silicon nitride film 49 may be formed and then etched anisotropically by RIE, thereby removing silicon nitride film portions on the upper flat surface and the trench bottom, and leaving the silicon nitride film 49 only on the side wall portion of the silicon oxide film 40, as shown in FIG. 15. Thereafter, the silicon oxide film 41 is removed by the same step as in FIG. 11. The second polysilicon film 42 and then the n-type layer 43 are formed. In this structure, the first and second polysilicon films 39 and 42 at the bottom of the trench can be insulated by a two-layer film consisting of the silicon oxide film 40 and the silicon nitride film 49.

EXAMPLE 2

Figure 16:
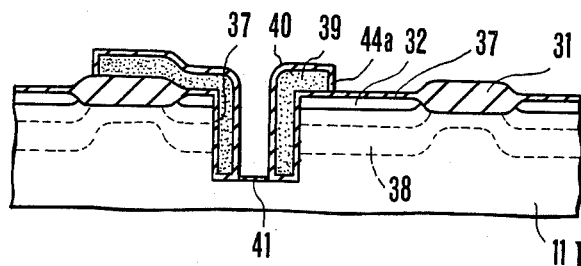

The same steps as in FIGS. 6 to 9 of Example 1 are performed. A predetermined gate electrode resist pattern is formed by lithography, and the silicon oxide film 40 and the polysilicon film 39 are etched by RIE using the resist pattern as a mask. A 1,000 Å thick silicon oxide film 44a is formed by wet oxidation at a temperature of 600° to 650° C. on the exposed side wall surface of the polysilicon film 39, as shown in FIG. 16. In this case, thicknesses of portions of the silicon oxide film 40 on the polysilicon film 39 and of the silicon oxide film 41 on the bottom of the trench are slightly increased.

Figure 17:
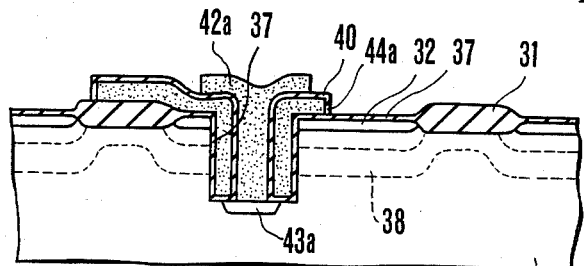

The silicon oxide film 41 is etched by the hydrofluoric acid solution from the bottom of the trench. A polysilicon film 42a and an n-type layer 43a are formed in the same manner as in Example 1. The polysilicon film 42a is patterned at a predetermined shape by lithography and RIE, as shown in FIG. 17. The subsequent steps are the same as those in Example 1.

In Example 1, the contact region of the second polysilicon film 42 is limited to a region above the first polysilicon film 39. However, in Example 2, the second polysilicon film 42a is formed independently of the first polysilicon film 39. For example, when a plurality of FETs having an identical structure are continuously formed, the electrode as the second polysilicon film can be formed together with the gate electrode as the first polysilicon film of adjacent FETs, thereby increasing the packing density of the device.

In Examples 1 and 2, the n-type layers 43 and 43a at the bottoms of the trenches are formed by thermal diffusion using the second polysilicon films 42 and 42a as impurity sources, respectively. However, an impurity may be doped by ion implantation or epitaxial diffusion in the step of FIG. 9 or 10, as will be described in the following example.

EXAMPLE 3

Figure 18:
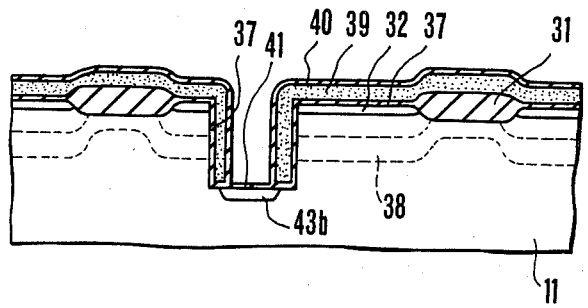

After forming the structure shown in FIG. 10, arsenic is ion-implanted in the bottom of the trench at a does of $5 \times 10^{15}$ cm$^{-2}$ and an acceleration voltage of 80 keV, thereby forming an n-type layer 43b (FIG. 18). The subsequent steps are the same as those in Examples 1 and 2. However, phosphorus need not be diffused from the second polysilicon film.

In Examples 2 and 3, the dielectric breakdown voltage between the first and second polysilicon films can be improved in the manner as shown in FIG. 15.

Figure 19:
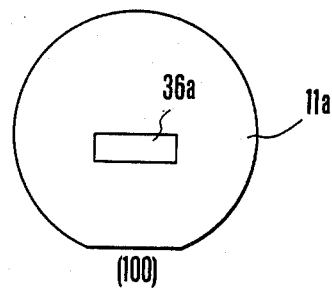

A p-type silicon substrate 11a having an orientation flat along the <100> axes may be used, and a trench formation resist pattern may be formed such that the sides of a rectangular trench 36a are parallel with the <100> axes, as shown in FIG. 19. The crystallographic axis along a direction perpendicular to the trench side surface can be the <100> axes, i.e., the side wall surface of the trench can be parallel to the (100) plane. Therefore, an interface level between the p-type silicon substrate and the silicon oxide film formed thereon can be minimized. As a result, the leakage current characteristic (i.e., a subthreshold tail coefficient) of the FET can be improved.

A side wall surface of the trench formed in the major surface of the semiconductor substrate can be inclined at an angle of 70° with respect to the major surface. However, when the diffusion layer at the bottom of the trench formed by ion implantation is greatly inclined, especially has a large depth, ions may be implanted in the side wall surface as well as the bottom. In order to prevent this, the side wall surface must be covered. In this sense, it is preferable that the trench is substantially vertically formed with respect to the major surface of the substrate. When the side wall surface of the trench is formed in a direction perpendicular to the <100> crystal axes, the trench must be formed with substantial accuracy at an angle of 90° with respect to the major surface of the substrate.

Figure 20:
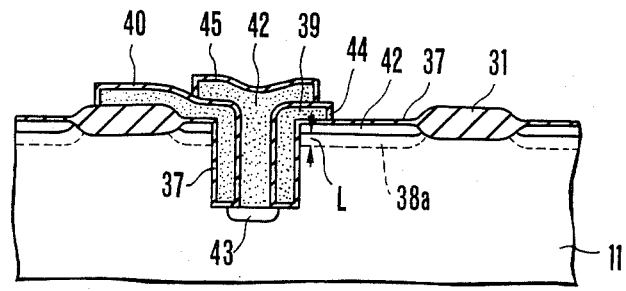
FIGS. 6 to 20 are sectional views for explaining methods of manufacturing the vertical MOSFET shown in FIG. 4.

According to the vertical MOSFET of the present invention, the channel doped layer 38 is formed between the bottom of the trench and the upper source/drain region so as to have a predetermined thickness. In this case, an effective channel length for determining a channel resistance corresponds to the predetermined thickness. The distance between the upper and lower source/drain regions can be shortened, and the punch-through tends not to occur due to the presence of the channel doped layer, thereby improving the dielectric breakdown voltage between the source and drain. A channel doped layer 38a (FIG. 20) can be formed such that a region having the highest boron concentration, i.e., the center of the stripe region of FIG. 8 is aligned with the bottom of the n-type layer 32. In this case, an effective channel length L can be further shortened, and the depth of the trench can be decreased. When the trench is shallow, the n-type layer can be easily formed by ion implantation, or different films can be easily formed in the trench. Although the channel doped layer can be formed near the n-type layer 43 at the bottom of the trench, a higher acceleration voltage must be applied during ion implantation. In this manner, it is very easy to form the channel doped layer at the upper layer of the substrate. The n-type layer contacting the channel doped layer preferably serves as the source region for the following reason. When the n-type layer is used as the drain, a voltage of +5 V is normally applied to the drain, and a potential difference between the drain and the substrate kept at a voltage of −1 to −2 V becomes 7 V. A strong electric field is formed, and a depletion layer tends not to extend, thereby degrading the dielectric breakdown voltage. However, when the n-type region is used as the source, the source is kept at ground potential. As a result, the depletion layer can be easily controlled by the source.

In the above embodiment, the substrate is exemplified by the p-type silicon substrate. However, the substrate is not limited to the p-type silicon substrate but can be replaced with an n-type substrate. In this case, the conductivity types of the respective regions are reversed.

Furthermore, when the second conductive layer is formed after the first conductive layer is etched to obtain the predetermined pattern, the second conductive layer is normally etched after the diffusion layer is formed in the bottom of the trench. However, the diffusion layer may be formed after the second conductive layer is etched. When the diffusion layer is formed in the bottom of the trench and the first conductive layer is patterned before the second conductive layer, the first conductive layer is normally etched after the diffusion layer is formed so as to prevent a charge-up phenomenon since the conductive layer preferably covers the entire surface. However, the process is not limited to the above order.

In the above embodiment, the MOSFET has the channel doped region. However, the channel region need not be formed.

In the above embodiment, the diffusion layer is formed around the opening of the trench, and the entire region around the trench serves as the channel region. In this case, the resultant MOSFET has a high current drive capability, as described above. However, the diffusion layer need not be formed in the entire region around the trench. A diffusion layer can be partially formed in the region around the trench to partially use the region as a channel region. In this case, the obtained MOSFET does not have a high current drive capability. However, the gate, source and drain electrodes can be connected to the major surface of the substrate, and the transistor area is decreased when viewed from the top.

According to the present invention as described above, the upper and lower source/drain regions are formed at the bottom of the trench formed in the major surface of the semiconductor substrate and in an upper surface layer of the semiconductor substrate. The gate electrode is formed on the side wall surface of the trench, and the electrode connected to the lower source/drain region is filled in the trench. The lower source/drain region can be electrically connected to a corresponding wiring layer at least immediately above the gate electrode. Unlike the conventional vertical MOSFET, application limitation can be eliminated. Furthermore, since the effective channel width is the length around the trench, the vertical MOSFET has a larger current drive capability than those of the conventional vertical and lateral MOSFETs.

In the manufacturing process, a surface diffusion layer is formed immediately after LOCOS process. However, the method of the present invention is not limited to this, and a surface diffusion layer as a source/drain layer need only be formed in a manner such that it can be connected with Al wiring. Therefore, after a gate electrode and electrode wiring are formed, a surface diffusion layer can be formed by self-alignment using the electrode and wiring as masks.

What is claimed is:

1. A method of manufacturing a vertical metal oxide semiconductor field effect transistor, comprising the steps of:
    forming a trench in a major surface of semiconductor substrate of a first conductivity type, said trench having a side wall surface substantially perpendicular to said major surface of said semiconductor substrate, and said trench being formed in a region adjacent to a source or drain region in said semiconductor substrate;
    forming a gate insulating film on the side wall surface and the bottom of said trench;
    forming a first conductive layer over said gate insulating film along an inner wall surface and the bottom of said trench so as not to completely fill said trench with said first conductive layer, a portion of said first conductive layer extending above said major surface;
    removing those portions of said first conductive layer and said gate insulating film overlying the bottom of said trench excepting the bottom edges of said first conductive layer and said gate insulating film;
    forming an insulating film on the surface of said first conductive layer;
    forming a diffusion layer of a second conductivity type below the bottom of said trench; and
    forming an electrode pattern with those portions of said first conductive layer extending above said major surface.

2. A method according to claim 1, further comprising the step of forming a channel doped layer in a given region of said semiconductor substrate adjacent said trench at a depth from said major surface of said semiconductor substrate so as to be in contact with said side wall surface of said trench.

3. A method according to claim 1, wherein said step of forming a diffusion layer includes the steps of forming a contact hole through said insulating film, and doping an impurity into said semiconductor substrate through said contact hole.

4. A method according to claim 3, further comprising the step of forming a channel doped layer in a given region of said semiconductor substrate adjacent said trench at a depth from said major surface of said semiconductor substrate so as to be in contact with said side wall surface of said trench.

5. A method according to claim 1, wherein
the step of forming said diffusion layer comprises the steps of filling a second conductive layer in contact with the bottom of said trench, said second conductive layer being completely filled in said trench a portion of said second conductive layer extending above said major surface, and doping an impurity from said second conductive layer to form said diffusion layer, and wherein
the step of forming said electrode pattern comprises the steps of etching simultaneously those portions of said first and second conductive layers extending above said major surface to obtain a first pattern after said diffusion layer is formed, and further etching those portions of said second conductive layer extending above said major surface to obtain a second pattern.

6. A method according to claim 5, wherein said impurity is doped by annealing so as to form said diffusion layer of the second conductivity type in said bottom of said trench.

7. A method according to claim 1, wherein
the step of forming said diffusion layer comprises the step of doping an impurity in the bottom of said trench to form a diffusion layer of the second conductivity type, and
the step of forming said electrode pattern comprises the steps of forming a second conductive layer in contact with said diffusion layer so as to fill said trench a portion of said second conductive layer extending above said major surface, etching simultaneously those portions of said first and second conductive layers extending above said major surface to obtain a first pattern, and etching that portion of said second conductive layer extending above said major surface to obtain a second pattern.

8. A method according to claim 7, wherein said impurity is doped by ion implantation so as to form said diffusion layer of the second conductivity type in said bottom of said trench.

9. A method according to claim 1, wherein
the step of forming said diffusion layer comprises the steps of forming a second conductive layer in contact with the bottom of said trench, said second conductive layer being completely filled in said trench, a portion of said second conductive layer extending above said major surface, and doping an impurity in the bottom of said trench to form said diffusion layer of the second conductivity type, and wherein
the step of forming said electrode pattern comprises the steps of etching that portion of said first conductive layer extending above said major surface to obtain a first pattern before said second conductive layer is formed in said trench, and etching that portion of said second conductive layer extending above said major surface to obtain a second pattern after said impurity is doped in said bottom of said trench.

10. A method according to claim 9, wherein said impurity is doped by annealing so as to form said diffusion layer of the second conductivity type in said bottom of said trench.

11. A method according to claim 1, wherein
the step of forming said diffusion layer comprises the step of doping an impurity in the bottom of said trench to form said diffusion layer of said second conductivity type, and
the step of forming said electrode pattern comprises the steps of etching that portion of said first conductive layer extending above said major surface to obtain a first pattern, forming a second conductive layer in contact with said diffusion layer so as to fill said trench a portion of said second conductive layer extending above said major surface, and etching that portion of said second conductive layer extending above said major surface to obtain a second pattern.

12. A method according to claim 11, wherein said impurity is doped by ion implantation so as to form said diffusion layer of the second conductivity type in said bottom of said trench.

* * * * *